United States Patent

Schmitt-Landsiedel et al.

Patent Number: 6,037,885
Date of Patent: Mar. 14, 2000

[54] DIGITAL/ANALOG CONVERTER USING A FLOATING GATE MOS NEURON TRANSISTOR WITH CAPACITIVE COUPLING

[75] Inventors: Doris Schmitt-Landsiedel, Ottobrunn; Roland Thewes, Groebenzell; Doktorand Andreas Luck, Munich; Werner Weber, Munich, all of Germany

[73] Assignee: Siemens Aktiengesellschaft, Munich, Germany

[21] Appl. No.: 09/007,252

[22] Filed: Jan. 14, 1998

[30] Foreign Application Priority Data

Jan. 14, 1997 [DE] Germany .............. 197 00 983

[51] Int. Cl.[7] .............. H03M 1/00; H03M 1/66
[52] U.S. Cl. .............. 341/136; 341/150
[58] Field of Search .............. 706/33, 35, 36; 307/201; 341/136, 144, 145, 150; 257/239; 327/143, 337; 330/277; 326/36

[56] References Cited

U.S. PATENT DOCUMENTS

| | | | |
|---|---|---|---|
| 4,998,108 | 3/1991 | Ginthner et al. .............. | 341/145 |
| 5,343,555 | 8/1994 | Yayla et al. .............. | 706/35 |
| 5,376,935 | 12/1994 | Seligson .............. | 341/136 |
| 5,682,111 | 10/1997 | Bacrania et al. .............. | 327/143 |
| 5,875,126 | 2/1999 | Minch et al. .............. | 327/337 X |

OTHER PUBLICATIONS

"A Functional MOS Transistor Featuring Gate–Level Weighted Sum And Threshold Operations", Shibata et al. IEEE Trans. on Electron Devices, vol. 39, No. 6, Jun. 1992, pp. 1444–1456.

Primary Examiner—Brian Young
Assistant Examiner—Patrick Wamsley
Attorney, Agent, or Firm—Hill & Simpson

[57] ABSTRACT

A digital/analog converter has a neuron MOS transistor, a maintenance circuit which keeps the drain potential of the neuron MOS transistor constant, and a current source. A linear dynamic range in terms of large signal is possible, so that converters having a larger input word size than, for example, only two bits can be realized in a simple way with low dissipated power. Such converters are of significance particularly for ULSI circuits.

10 Claims, 5 Drawing Sheets

DIGITAL/ANALOG CONVERTER USING A FLOATING GATE MOS NEURON TRANSISTOR WITH CAPACITIVE COUPLING

BACKGROUND OF THE INVENTION

1. Field of the Invention

The present invention is directed to a digital-to-analog converter of the type constructed on the basis of neuron MOS transistors.

2. Description of the Prior Art

Due to advantageous properties such as, for example, low space requirement, low dissipated power and simple structure, neuron MOS transistors form an ideal point of departure for a large number of circuit applications, particularly in the field of ULSI circuits.

IEEE Transactions on Electron Devices, Vol. 39, No. 6, June 1992, pages 1444 through 1455, particularly FIG. 16 on page 1453, discloses a two-bit digital/analog converter on the basis of neuron MOS transistors. This is a very simple digital/analog converter with two complementary neuron MOS transistors whose common floating gate is influenced by an input with the weighting 1 and an input with the weighting 2. Due to the non-linearity of the circuit, however, digital/analog converters having a larger input word size than two bits cannot be achieved in this way.

SUMMARY OF THE INVENTION

An object of the present invention is to provide a digital/analog converter on the basis of neuron MOS transistors that is also suitable for an input word size greater than two bits and that requires optimally little added circuit outlay.

The above object is achieved in accordance with the principles of the present invention in a digital-to-analog converter having a neuron MOS transistor and a maintenance circuit for keeping the drain voltage of the neuron MOS transistor constant and a current source connected in series. The current source is connected to a first supply voltage and the neuron MOS transistor is connected to a second supply voltage. Converter inputs for a digital word are capacitively connected via coupling capacitances to a floating gate of the neuron MOS transistor. The converter input having a place value i is connected to the floating gate via a coupling capacitance which is larger by the factor of $2^{i-1}$ than a smallest of the coupling capacitances associated with converter input having the place value i=1. A converter output is directly coupled to the current source, and is capacitively connected to the floating gate via a further coupling capacitance.

DESCRIPTION OF THE PREFERRED EMBODIMENTS

Figure 1:
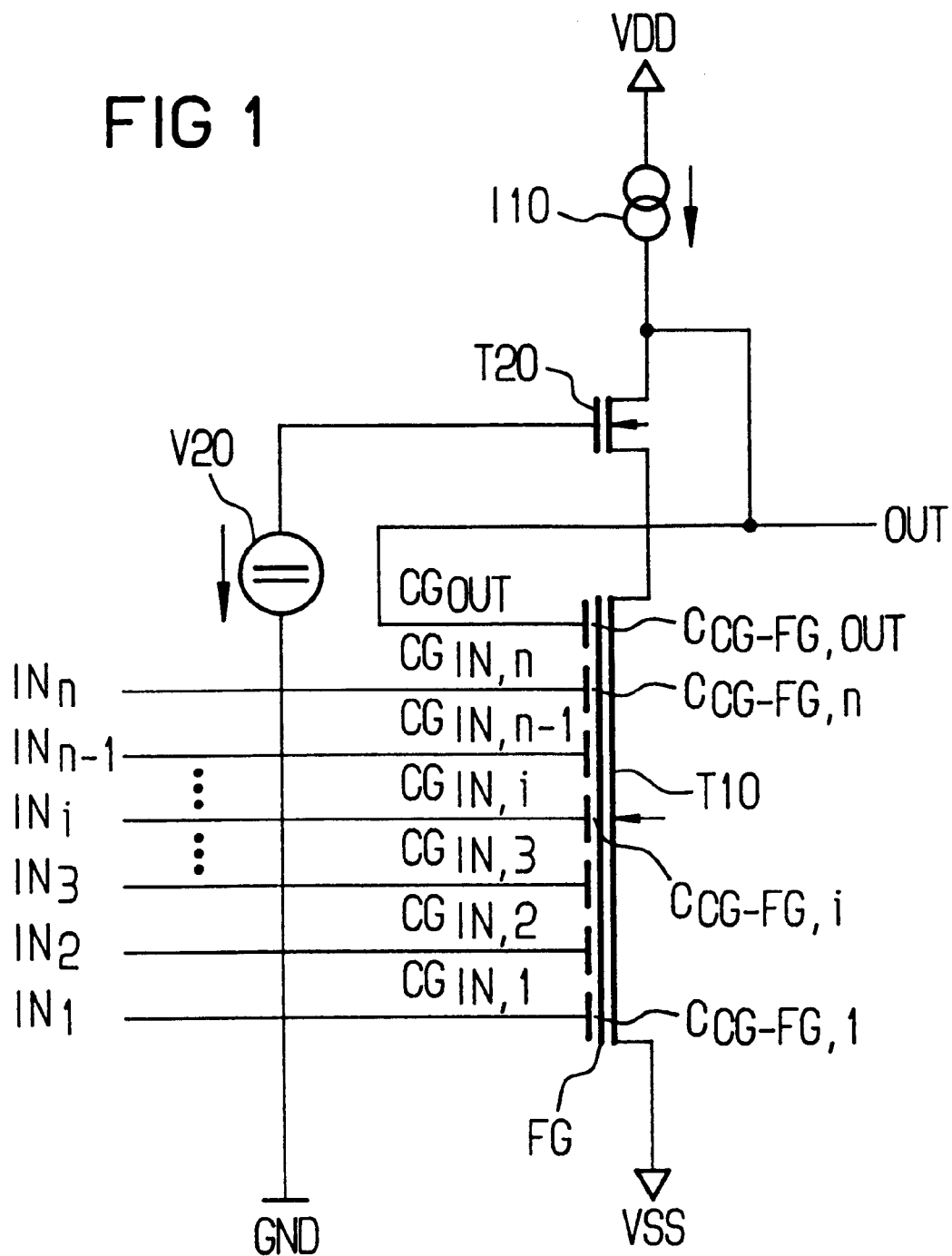
FIG. 1 is a basic circuit diagram of a digital/analog converter constructed in accordance with the principles of the present invention.

FIG. 1 shows an inventive digital/analog converter with a neuron MOS transistor T10, a maintenance circuit composed of an MOS transistor T20 and a voltage source V20 for keeping the drain potential of the neuron MOS transistor constant, and a constant current source I10. A first terminal of the constant current source I10 is connected to a supply voltage VDD and a second terminal of the constant current source I10 is connected to a first terminal of the transistor T20. A second terminal of the transistor T20 is connected to a further supply voltage VSS via the drain-source path of the neuron MOS transistor. The voltages VDD and VSS are often implemented symmetrical to the ground potential GND of the digital/analog converter. The gate of the transistor T20 is connected to the ground potential GND via the voltage source V20, and the terminal of the transistor T20 connected to the current source I10 is also connected to an analog output OUT as well as to an electrode $CG_{OUT}$ (coupling gate) of the neuron MOS transistor. It is assumed that the output OUT is unloaded in the ohmic sense; for example, it is connected to a gate electrode of a further, following MOS transistor, and the impressed constant current I10 thus flows through the neuron MOS transistor T10 exclusively via the transistor T20.

Keeping the drain potential of the transistor T10 constant is effected in the following way.

Since the transistor T20 works in saturation in the nominal operating case, a constant gate-source voltage is established at the transistor T20. Since the gate potential of the transistor T20 is in turn predetermined via the voltage source V20, a constant source potential of the transistor T20 also occurs, as does a constant drain potential of the neuron MOS transistor T10. Given a corresponding selection of the voltage of the constant voltage source V20, a wide dynamic range with linear transmission or transfer behavior is achieved.

The digital/analog converter has parallel digital converter inputs $IN_1 \ldots IN_n$ that are connected to corresponding electrodes $CG_{IN,1} \ldots CG_{IN,n}$ of the neuron MOS transistor T10. These electrodes, together with a floating gate FG of the neuron MOS transistor T10, form coupling capacitances $C_{CG-FG,1} \ldots C_{CG-FG,n}$. A converter input $In_i$ with the place value i in the input word, is connected via a coupling capacitance $C_{CG-FG,i}$ that is greater by the factor $2^{i-1}$ than a smallest coupling capacitance $C_{CG-FG,1}$ belonging to the converter input $IN_1$ with the place value i=1. The capacitance $C_{CG-FG,OUT}$ formed by the electrode $CG_{OUT}$ and the floating gate FG can, for example, be as large as the sum of all coupling capacitances connected to the inputs.

The coupling capacitances are set by the electrode surfaces (i.e., the respective surface areas thereof) since the coupling capacitances are proportional to the electrode surface areas and the electrode surface areas can be set simply and reproducibly, compared, for example, to varying the relative dielectric constant or the plate spacing.

The output OUT of the circuit supplies the following output voltage:

$$V_{OUT} = \frac{C_{ges}}{C_{CG-FG,OUT}} \times V_D - \sum_{i=1}^{n} \frac{C_{CG-FG,1}}{C_{CG-FG,OUT}} \times V_{IN,i},$$

wherein $C_{ges}$ represents the sum of all capacitances having one electrode forming the floating gate, this being calculated as follows:

$$C_{ges} = C_{CH-FG} + C_{CG-FG,OUT} + \sum_{i=1}^{n} C_{CG-FG,i}.$$

The capacitance $C_{CH-FG}$ is thereby formed by the channel and the floating gate of the neuron transistor T10.

The voltage $V_0$ is a function of the set operating point of the transistor T10. Further, a charging of the floating gate (this charging may be process-dependent) also play a role. Due to a suitable selection of a constant current I10 and/or due to an additional coupling gate that is connected to a balancing voltage, for example, the voltage $V_0$ can be balanced to 0 Volts. Given this assumption, the following transfer function of the digital/analog converter exists for the output voltage:

$$V_{OUT} = -\sum_{i=1}^{n} \frac{C_{CG-FG,i}}{C_{CG-FG,OUT}} \times V_{IN,i}$$

When a symmetrical supply voltage is assumed, i.e. VDD=−VSS, and the digital input word with the input bits $b_i$ with i=1 ... n is defined such that the voltage $V_{IN,i}$=VDD applies insofar as the input bit $b_i$ is equal to logical one and the input voltage $V_{IN,i}$=VSS applies insofar as the input bit $b_i$ is equal to logical zero, the output voltage $V_{OUT}$ can be calculated as follows, dependent on the input bits $b_i$:

$$V_{OUT} = -\sum_{i=1}^{n} \frac{C_{CG-FG,i}}{C_{CG-FG,OUT}} \times \left(2 \times \left(b_i - \frac{1}{2}\right)\right) \times VDD$$

$$= -\frac{C_{CG-FG,1}}{C_{CG-FG,OUT}} \times VDD \times \sum_{i=1}^{n} 2^i \times \left(b_i - \frac{1}{2}\right)$$

The linear dynamic range is dependent on the specific design of the circuit and on the properties of the actual circuit of the current source I10 and ranges between about 60 percent and 96 percent of the two supply voltage VDD and VSS.

Figure 2:
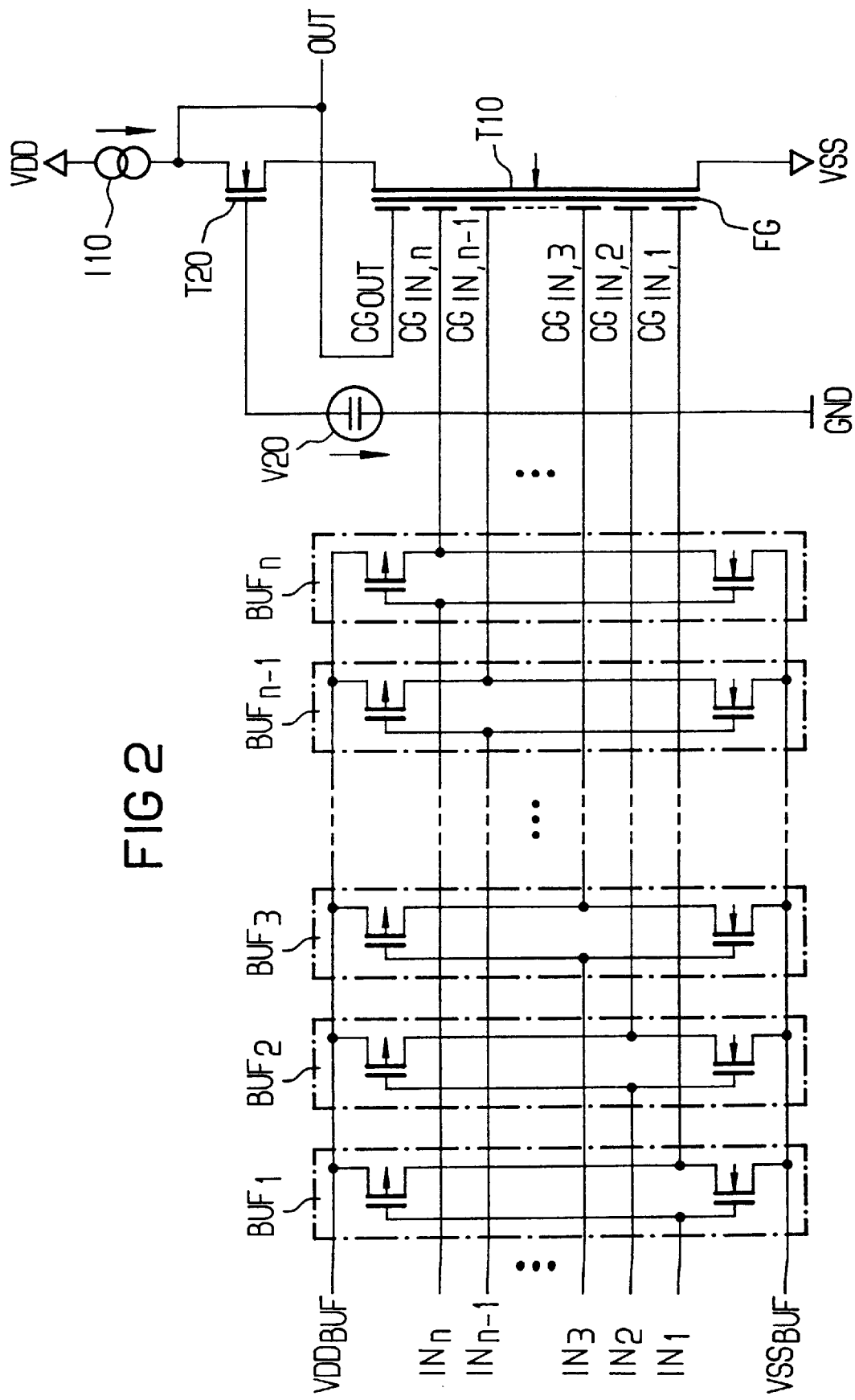
FIG. 2 is a circuit diagram of a further embodiment of an inventive digital/analog converter, with an adjustable dynamic range.

It can be useful in many applications to fashion the dynamic range for analog signals so as to be variable, with the limits thereof being set by voltages which are externally applied to the circuit of the converter. FIG. 2 shows such an embodiment of the inventive digital/analog converter, wherein the coupling gates $C_{GIN,i}$ here are not directly coupled to the inputs $IN_1 \ldots IN_n$ but are coupled via inverters $BUF_1 \ldots BUF_n$ for buffering the input signals $V_{IN,i}$. The source nodes of the n-MOS transistors of these inverters are connected to a voltage $VSS_{BUF}$ and the source nodes of the p-MOS transistors are connected to a voltage $VDD_{BUF}$. The voltages $VSS_{BUF}$ and $VDD_{BUF}$ must be selected such that they lie within the linear range of the transfer function of the converter according to FIG. 1. When the dimensioning of $$C_{CG-FG,OUT} = \sum_{i=1}^{n} C_{CG-FG,i} = (2^n - 1) \times C_{CG-FG,1}$$

is selected for the output coupling gate, a minimum voltage of $-VDD_{BUF}$ and a maximum voltage of $|VSS_{BUF}|$ can be established at the output OUT. In this case, the transfer function is:

$$V_{OUT} = -\left(VDD_{BUF} + VSS_{BUF} \times \frac{1}{2^n - 1} \sum_{i=1}^{n} 2^{i-1} \times b_i\right)$$

$$= -VDD_{BUF} + |VSS_{BUF}| \times \frac{1}{2^n - 1} \sum_{i=1}^{n} 2^{i-1} \times b_i$$

The capacitance relationships of the input coupling gate of the digital/analog converters shown in FIGS. 1 and 2 satisfy a power function to the base 2. In order to assure that the provided weighting is followed optimally well through conversion into a circuit layout and the actual integrated circuit, it is useful to employ the neuron MOS transistor T10 with a sufficiently large number of sub-electrodes or coupling gates. A corresponding number of these sub-electrodes are connected parallel to one another in order to provide the signals that are employed for the drive of the neuron transistor T10 with the desired weighting. It is also possible to arrange a coupling gate $CG_{IN,1}$, to which the signal $IN_1$ having the least weighting is conducted, centrally between all further coupling gates and to position the coupling gate to which signals with higher weighting are applied at both sides symmetrically relative to this first coupling gate.

Figure 3:
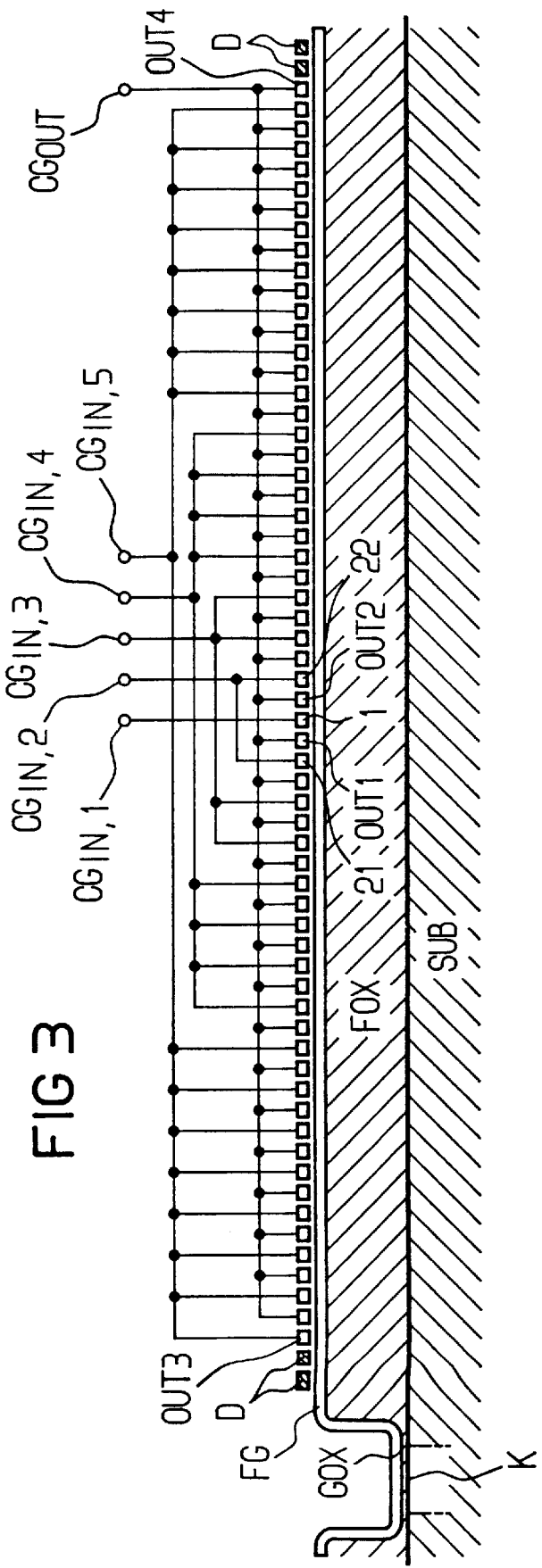
FIG. 3 is a schematic sectional view for explaining an embodiment of the neuron MOS transistor of the inventive digital/analog converter.
Figure 4:
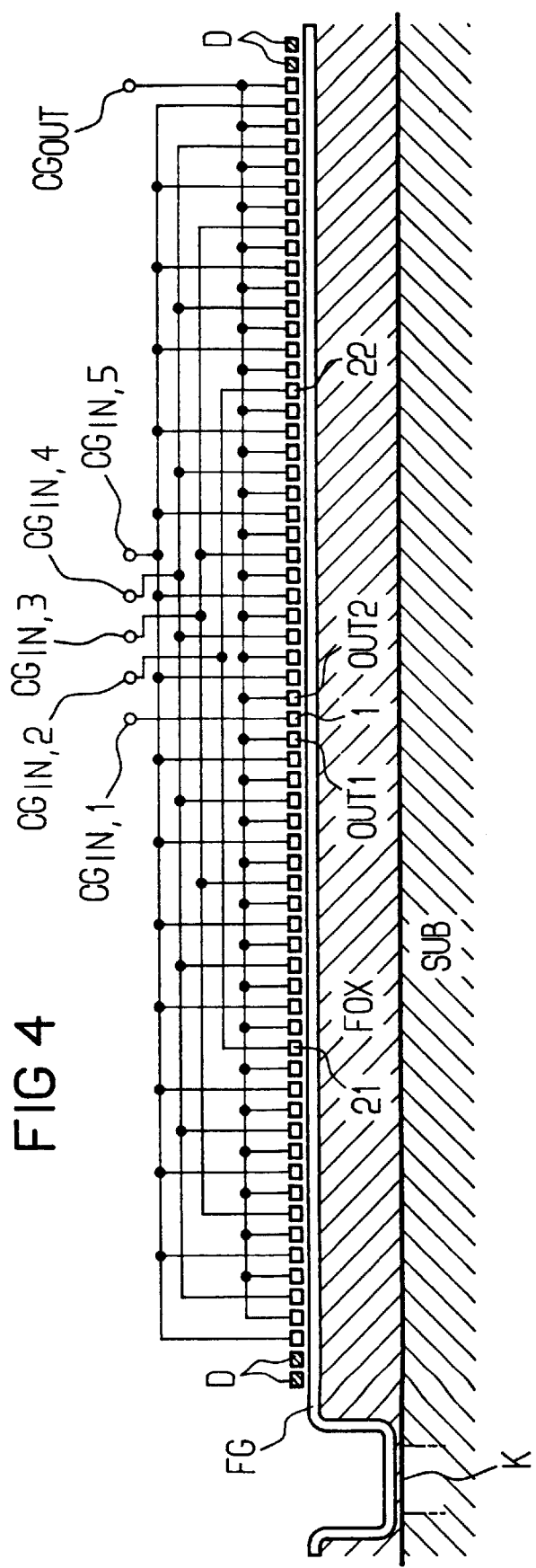
FIG. 4 is a schematic sectional view of a further embodiment of the neuron MOS transistor of the inventive digital/analog converter.

FIGS. 3 and 4 show two exemplary embodiments of such a neuron transistor T10 for, for example, five input bits. Both instances show a floating gate FG that is separated from a substrate SUB by a gate oxide GOX in a channel region K and by a field oxide FOX in the remaining region. In both instances, the coupling gate $CG_{IN,1}$ with the least significance is composed of only one sub-electrode 1 and all further sub-electrodes, that represent the more significant coupling gates, are symmetrically arranged next to this centrally arranged sub-electrode 1.

In FIG. 3, for example, the sub-electrodes OUT1 and OUT2, which represent a part of the coupling gate $CG_{OUT}$, lie symmetrically immediately next to the sub-electrode 1 and are followed by the two sub-electrodes 21 and 22 that together form the coupling gate $CG_{in,2}$.

The neuron MOS transistor of FIG. 4 differs from that shown in FIG. 3 only in terms of the sequence of the sub-electrodes; for example, the two sub-electrodes 21 and 22 are respectively placed approximately in the middle of the two electrode regions lying symmetrically relative to the electrode 1.

Both in FIG. 3 and in FIG. 4, so-called dummy electrodes are provided in an edge region outside the electrode regions symmetrical relative to the electrode 1. These dummy electrodes cause all signal-carrying coupling gates of the neuron MOS transistor T10 to encounter similar conditions in view of the topology of their immediate environment, which in turn improves the coincidence of the capacitance values which are set by the area relationships and the actual capacitance values.

As proceeds from the above description, the number of coupling gates increases exponentially with the word size of the input signal, i.e. with the number of bits to be processed, and thus increases with the required resolution. Given an 8-bit converter, the neuron transistor would require $2^{8-1}$ sub-electrodes for the input signals and another $2^{8-1}$ sub-electrodes for the output signal as well as, possibly, a few dummy sub-electrodes, i.e. a total of about $2^9$=512 coupling gates.

Figure 5:
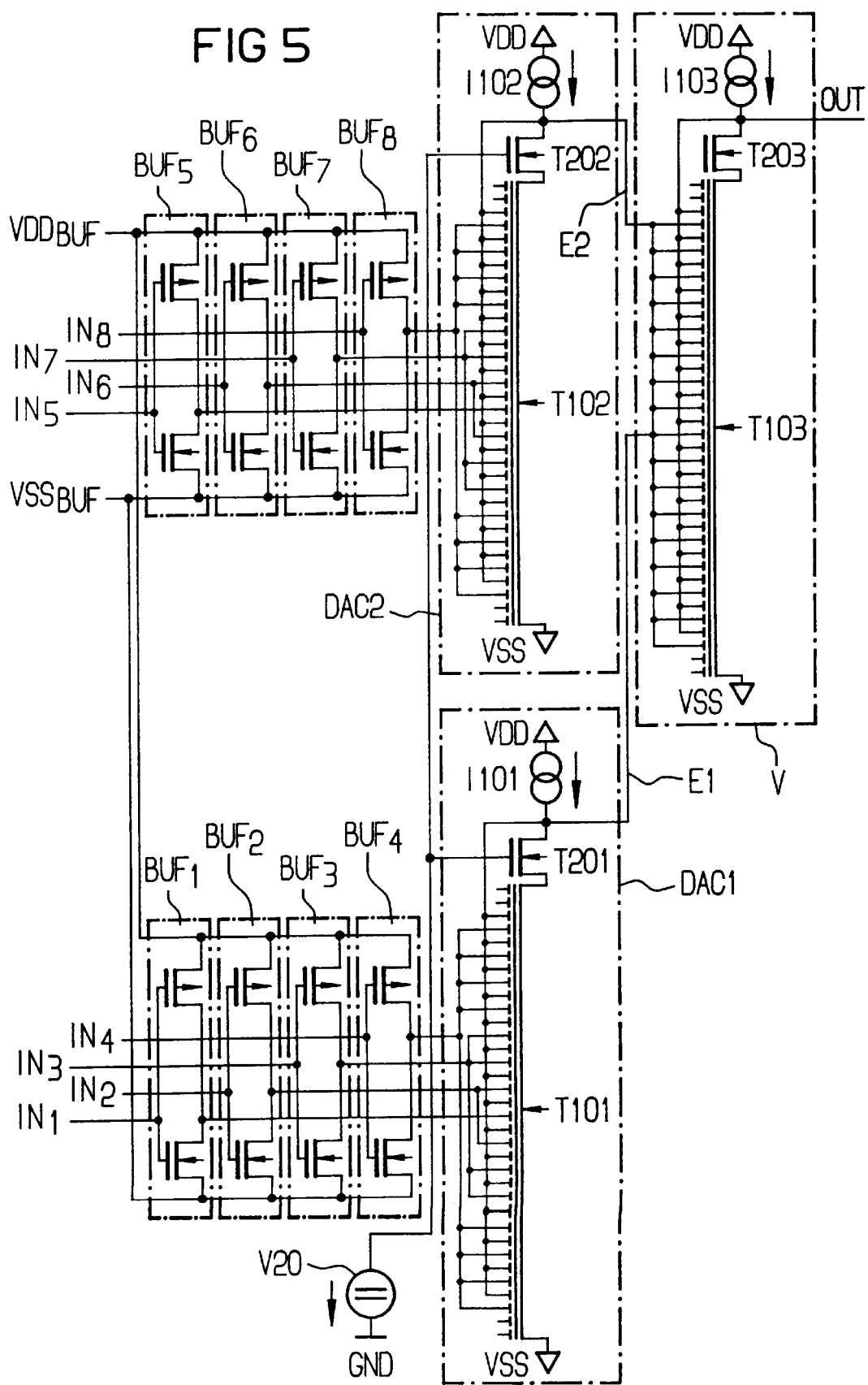
FIG. 5 is a circuit diagram of a high-resolution digital/analog converter on the basis of two digital/analog converters according to FIGS. 1 through 4.

FIG. 5 shows an exemplary embodiment of an inventive converter with which this outlay can be reduced, or with which the employment of such large neuron MOS transistors can be avoided. This 8-bit cascade converter is basically composed of two converters as shown in FIG. 1 or FIG. 2.

In the example shown in FIG. 5, the low-significance, four inputs $IN_1 \ldots 1N_4$ are connected via inverters $BUF_1 \ldots BUF_4$ to a converter DAC1 according to FIG. 1, and the more significant, four inputs $IN_5 \ldots IN_8$ are connected via inverters $BUF_5 \ldots BUF_8$ to a further converter DAC2 according to FIG. 1. An output E1 of the converter DAC1 is summed up in a summing amplifier V with a weighting $2^{-4}$ and an output E2 of the converter DAC2 is summed up with a weighting 1. In the general case, when k represents the maximum weighting of the converter DAC1, the output E1 is weighted with the factor $2^{-k}$. The amplifier V can be constructed similar to the two converters DAC1 and DAC2.

Of course, it is also possible to construct all shown circuits complementary to the illustrated exemplary embodiments. In this case, the terminals VDD and VSS must be interchanged and all n-channel transistors must be interchanged with p-channel transistors and vice versa.

Although modifications and changes may be suggested by those skilled in the art, it is the intention of the inventors to embody within the patent warranted hereon all changes and modifications as reasonably and properly come within the scope of their contribution to the art.

We claim as our invention:

1. A digital-to-analog converter comprising:
   a single neuron MOS transistor having a floating gate and a drain potential associated therewith;
   maintenance circuit means for maintaining said drain potential of said neuron MOS transistor constant;
   a current source, said neuron MOS transistor, said maintenance circuit means and said current source being connected in series;
   means for connecting said current source to a first supply voltage;
   means for connecting said neuron MOS transistor to a second supply voltage;
   a plurality of converter inputs which receive a digital input word, said plurality of converter inputs respectively having place values i and including a converter input having a place value i=1;
   a plurality of coupling capacitances respectively capacitively coupling all of said converter inputs to said floating gate of said neuron MOS transistor and including a smallest coupling capacitance associated with said converter input having the place value i=1, said coupling capacitances respectively coupling said plurality of converter inputs to said floating gate with respective different coupling capacitances which are successively larger by a factor $2^{i-1}$ than said smallest coupling capacitance; and
   a converter output directly connected to said current source and capacitively connected to said floating gate via a further coupling capacitance.

2. A digital-to-analog converter as claimed in claim 1 wherein said maintenance circuit means comprises an MOS transistor having a first terminal connected to said current source and a second terminal connected to a drain terminal of said neuron MOS transistor, and a gate terminal connected to reference potential via a voltage source.

3. A digital-to-analog converter as claimed in claim 1 further comprising a plurality of input inverter stages, respectively connected between said converter inputs and said coupling capacitances, each of said input inverter stages being connected to a supply voltage which is smaller than each of said first and second supply voltages.

4. A digital-to-analog converter as claimed in claim 1 wherein each of said coupling capacitances and said further coupling capacitance has an electrode adjacent said floating gate composed of a plurality of sub-electrodes, said sub-electrodes being disposed so that any two adjacent sub-electrodes have connections respectively selected from the group of connections comprising connections to two different converter inputs and a connection to one of said converter inputs and a connection to said converter output.

5. A digital-to-analog converter as claimed in claim 4 wherein each electrode is composed of i sub-electrodes of equal size, wherein i is the place value of the converter input connected to the sub-electrodes.

6. A digital-to-analog converter as claimed in claim 4 wherein said converter output includes sub-electrodes at an edge region of said floating gate which are not connected to a converter input and are not connected to said converter output.

7. A digital-to-analog converter comprising:
   a first digital-to-analog converter and a second digital-to-analog converter, each of said first and second digital-to-analog converters comprising:
      a single neuron MOS transistor having a floating gate and a drain potential associated therewith;
      maintenance circuit means for maintaining said drain potential of said neuron MOS transistor constant;
      a current source, said neuron MOS transistor, said maintenance circuit means and said current source being connected in series;
      means for connecting said current source to a first supply voltage;
      means for connecting said neuron MOS transistor to a second supply voltage;
      a plurality of converter inputs which receive a digital input word, said plurality of converter inputs respectively having place values i and including a converter input having a place value i=1;
      a plurality of coupling capacitances respectively capacitively coupling all of said converter inputs to said floating gate of said neuron MOS transistor and including a smallest coupling capacitance associated with said converter input having the place value i=1, said coupling capacitances respectively coupling said plurality of converter inputs to said floating gate with respective different coupling capacitances which are successively larger by a factor $2^{i-1}$ than said smallest coupling capacitance; and
      a converter output directly connected to said current source and capacitively connected to said floating gate via a further coupling capacitance;
   said first digital-to-analog converter having k converter inputs and said second digital-to-analog converter having a plurality of converter inputs larger than k; and
   a summation amplifier having a plurality of weighted inputs including a $2^{-k}$ weighted input connected to the converter output of said first digital-to-analog converter and a weighted input weighted with a value of one connected to the converter output of said second digital-to-analog converter.

8. A digital-to-analog converter comprising:
   a single neuron MOS transistor having a floating gate and a drain potential associated therewith;
   maintenance circuit means for maintaining said drain potential of said neuron MOS transistor constant;
   a current source, said neuron MOS transistor, said maintenance circuit means and said current source being connected in series;
   means for connecting said current source to a first supply voltage;

means for connecting said neuron MOS transistor to a second supply voltage;

a plurality of converter inputs which receive a digital input word, said plurality of converter inputs respectively having place values i and including a converter input having a place value i=1;

a plurality of coupling capacitances respectively capacitively coupling all of said converter inputs to said floating gate of said neuron MOS transistor and including a smallest coupling capacitance associated with said converter input having the place value i=1, said coupling capacitances respectively coupling said plurality of converter inputs to said floating gate with respective different coupling capacitances which are successively larger by a factor $2^{i-1}$ than said smallest coupling capacitance;

a converter output directly connected to said current source and capacitively connected to said floating gate via a further coupling capacitance; and each of said coupling capacitances and said further coupling capacitance having an electrode adjacent said floating gate composed of a plurality of sub-electrodes, said sub-electrodes being disposed so that any two adjacent sub-electrodes have connections respectively selected from the group of connections comprising connections to two different converter inputs and a connection to one of said converter inputs and a connection to said converter output.

9. A digital-to-analog converter as claimed in claim 8 wherein each electrode is composed of i sub-electrodes of equal size, wherein i is the place value of the converter input connected to the sub-electrodes.

10. A digital-to-analog converter as claimed in claim 8 wherein said converter output includes sub-electrodes at an edge region of said floating gate which are not connected to a converter input and are not connected to said converter output.

* * * * *